United States Patent
Ilsemann

(10) Patent No.: US 11,824,552 B2
(45) Date of Patent: Nov. 21, 2023

(54) REAL-TIME DIGITAL SPARKLE FILTER

(71) Applicant: Fredeick J. Ilsemann, Princeton, NJ (US)

(72) Inventor: Fredeick J. Ilsemann, Princeton, NJ (US)

(73) Assignee: Banc3 Inc, Princeton, NJ (US)

( * ) Notice: Subject to any disclaimer, the term of this patent is extended or adjusted under 35 U.S.C. 154(b) by 0 days.

(21) Appl. No.: 17/233,854

(22) Filed: Apr. 19, 2021

(65) Prior Publication Data

US 2022/0337265 A1  Oct. 20, 2022

(51) Int. Cl.
*H03M 1/12* (2006.01)
*G06F 7/523* (2006.01)
*H03M 1/06* (2006.01)
*H03M 1/08* (2006.01)

(52) U.S. Cl.
CPC ............ *H03M 1/129* (2013.01); *G06F 7/523* (2013.01); *H03M 1/0626* (2013.01); *H03M 1/0863* (2013.01); *H03M 1/12* (2013.01)

(58) Field of Classification Search
CPC .. H03M 1/129; H03M 1/0626; H03M 1/0863; H03M 1/12; G06F 7/523
See application file for complete search history.

(56) References Cited

U.S. PATENT DOCUMENTS 8,917,996 B2 * 12/2014 Belansky ................. H04Q 9/00
                                                    398/171
11,057,781 B2 * 7/2021 Pergal ....................... H04B 1/10

* cited by examiner

*Primary Examiner* — Khai M Nguyen

(57) ABSTRACT

A real-time digital sparkle filter for processing high-speed analog to digital converter (ADC) data is disclosed. The real-time digital sparkle filter for processing a continuous stream of digital data, comprising a high-speed data interface, a digital sparkle filter, and a buffer sequencer. The high-speed data interface receives sample data from an analog to digital converter (ADC). The digital sparkle filter operates continuously on the sample data without losing any samples. The digital sparkle filter comprises one or more logic implemented using field-programmable gate arrays (FPGAs) configured to continuously process the data without degrading the signal content. The buffer sequencer comprises an input buffer and an output buffer. The input buffer receives the digital data stream data using a first in first out buffer mechanism. The output buffer receives the processed output of the sparkle filter, thereby eliminating the sparkle noise without degrading data content.

15 Claims, 5 Drawing Sheets

REAL-TIME DIGITAL SPARKLE FILTER

BACKGROUND OF THE INVENTION

A. Technical Field

The present invention generally relates to digital receivers for use in radio frequency (RF) monitoring and more specifically relates to a system and method that uses high-speed analog to digital converters (ADC) for applications operating continuously on data samples using pipelined architectures.

B. Description of Related Art

Digital receiver applications require continuous processing of 100% of the input data stream using high-speed ADCs with up to 16 bits per sample. In cases where the data is processed in the frequency domain using Fast Fourier Transforms (FFT) with persistent maximum hold spectrum output and/or time-domain processing using the amplitude of the signal for enveloping detection or thresholding, sparkle noise causes random large coding errors in the output of the ADC.

Sparkle noise is a well-known phenomenon, which causes coding errors in the digital data stream, can result in elevated noise floors, degraded sensitivity, and false detections. The phenomenon of sparkle noise is related to the metastability of the comparators used in flash converters. As defined by Analog Devices MT-011 Tutorial titled "Find Those Elusive ADC Sparkle Codes and Metastable States" by Walt Kester, There is another subtle but troublesome characteristic of comparators that can cause large errors (sparkle codes) in ADCs if not understood and dealt with effectively. This error mechanism is the occasional inability of a comparator to resolve a small differential input into a valid output logic level. This phenomenon is known as metastability—the ability of a comparator to balance right at its threshold for an extended period of time Data was collected using commercially available ADC devices running at 3 GSPS demonstrate the sparkle errors consistently. A method implemented in real-time using a pipelined architecture is necessary to identify the errors and correct the data without dropping any data or causing significant latency.

Few existing patent references attempted to address the aforementioned problems are cited in the background as prior art over the presently disclosed subject matter and are explained as follows.

A prior art US 20170278289 A1 to William L. MARINO, et. al, entitled "Apparatus, systems, and methods for integrating digital media content into other digital media content" discloses a content integration system. The content integration system is configured to retrieve a source digital content, retrieve a target digital content, identify a region within the target digital content for placing or integrating the source digital content, and place or integrate the target digital content onto the identified region of the source digital content. The content integration system can be configured to place the source digital content into the target digital content in an aesthetically-pleasing, unobtrusive, engaging, and/or otherwise favorable manner. The content integration system can be particularly useful for advertisements, enhanced expression, entertainment, information, or communication.

Another prior art US 20200073143 A1 to John Graham McNamara, et. al, entitled "Light field processor system" discloses a wearable ophthalmic device. The device may include an outward-facing head-mounted light field camera to receive light from a user's surroundings and to generate numerical light field image data. The device may also include a light field processor to generate modified numerical light field image data by computationally introducing an amount of optical power to the numerical light field image data based on a viewing distance from the user to an object. The device may also include a head-mounted light field display to generate a physical light field corresponding to the modified numerical light field image data.

Though the discussed prior art references are useful to some extent for some purposes, these prior efforts sometimes yield a poor result by degrading the data content. Therefore, there is a need for a solution that operates on the digital output of the ADC in real-time to recognize and eliminate the sparkle noise on a sample-by-sample basis without degrading data content. Also, there is a need for a real-time digital sparkle filter that has been successfully tested on data streams to avoid degradation of the data content.

SUMMARY OF THE INVENTION

The present invention discloses digital receivers for use in radio frequency (RF) monitoring. More specifically, the present invention relates to a system and method that uses high-speed analog to digital converters (ADC) for applications operating continuously on data samples using pipelined architectures without degrading data content.

According to the present invention, a real-time digital sparkle filter provides a system and method to identify and eliminate erroneous data samples without degrading the content of the data. In one embodiment, a real-time digital sparkle filter processes a digital data stream of high-speed ADC samples to identify and eliminate errors resulting from the sparkle noise phenomenon. In one embodiment, the real-time sparkle filter is implemented as digital logic in a field-programmable gate array (FPGA). In one embodiment, a method for processing the digital data stream runs continuously and uninterrupted. The method eliminates/avoids the loss of any samples. The elimination of the sparkle errors improves the quality of the data especially for digital signal applications requiring a high degree of amplitude measurement accuracy.

In one embodiment, the real-time digital sparkle filter operates on a continuous stream of digital data. In one embodiment, the stream of digital data is comprised of 16-bit samples from an ADC. Each sample represents the instantaneous voltage of the signal at the input of the ADC. In one embodiment, the voltage range is dependent on the ADC device. In one embodiment, the voltage ranges from about $-Vpp/2$ to about $+Vpp/2$, where $Vpp$ is the peak-to-peak voltage of the input signal. In one embodiment, the range of values generated by the ADC for the 16-bit data would be $-32,768$ to $+32,767$. The real-time digital sparkle filter has been tested using sampling rates up to 3 GSPS. In one embodiment, the sample time at 3 GSPS is 0.333 ns per sample.

In one embodiment, the real-time digital sparkle filter for processing a continuous stream of digital data, comprises a high-speed data interface, a digital sparkle filter, and a buffer sequencer. In one embodiment, the high-speed data interface is configured to receive sample data from an analog to digital converter (ADC). In one embodiment, the digital sparkle filter is configured to operate continuously on the sample data without losing any samples. In one embodiment, the digital sparkle filter comprises one or more logic implemented using field-programmable gate arrays (FPGAs) configured to continuously process the data without degrading the signal content. In one embodiment, the buffer sequencer comprises an input buffer and an output buffer. In one embodiment, the input buffer receives the digital data stream data using a first in first out buffer mechanism. In one embodiment, the output buffer receives the processed output of the sparkle filter, thereby eliminating the sparkle noise without degrading data content.

In one embodiment, the real-time digital sparkle filter uses a digital data stream for identifying and eliminating the digital sparkle noise. In one embodiment, the logic is implemented using field-programmable gate arrays (FPGAs) configured to continuously process the data at 3 GSPS without degradation to the signal content of the data. The one or more logic includes a mean calculation logic, an absolute deviation calculation logic, an absolute calculation logic, a multiplier logic, and a sparkle noise threshold comparison logic.

In one embodiment, the calculation logic calculates the average of the input data. The absolute deviation calculation logic calculates the absolute deviation of the input data. In one embodiment, the absolute deviation calculation logic consists of mean calculation logic, addition logic, absolute value calculation logic, summation logic, and division logic. The absolute value/calculation logic then calculates the absolute value of each sample in the input data. The multiplier logic multiplies the absolute deviation by creating the sparkle threshold.

In one embodiment, the decision logic compares the absolute value of each sample in the input data with the sparkle noise threshold. In one embodiment, the sample is replaced by the mean value of the data set and written to the output buffer when the absolute value of the data sample is greater than 4 times the absolute deviation. In one embodiment, the sample is unchanged and written to the output buffer when the absolute value of the data sample is less than or equal to 4 times the absolute deviation. In one embodiment, the data is any of continuous wave signals, pulsed signals, and noise-only data. In one embodiment, the real-time digital sparkle filter works independently of the amplitude and frequency of the input samples.

In one embodiment, the real-time digital sparkle filter utilizes a method for processing a digital data stream continuously and in real-time for the purposes of identifying and eliminating digital sparkle noise. In one embodiment, the method is utilized for continuous wave signals. In another embodiment, the method is utilized for pulsed signals. In yet another embodiment, the method is utilized for noise-only signal. In one embodiment, the method works independently for the amplitude and frequency of the input samples, without affecting the content of the input samples. In one embodiment, the method also works on noise signals without eliminating any input data samples.

Other objects, features and advantages of the present invention will become apparent from the following detailed description. It should be understood, however, that the detailed description and the specific examples, while indicating specific embodiments of the invention, are given by way of illustration only, since various changes and modifications within the spirit and scope of the invention will become apparent to those skilled in the art from this detailed description.

BRIEF DESCRIPTION OF DRAWINGS

The embodiments herein will be better understood from the following detailed description with reference to the drawings, in which.

DETAILED DESCRIPTION OF EMBODIMENTS

Figure 1:
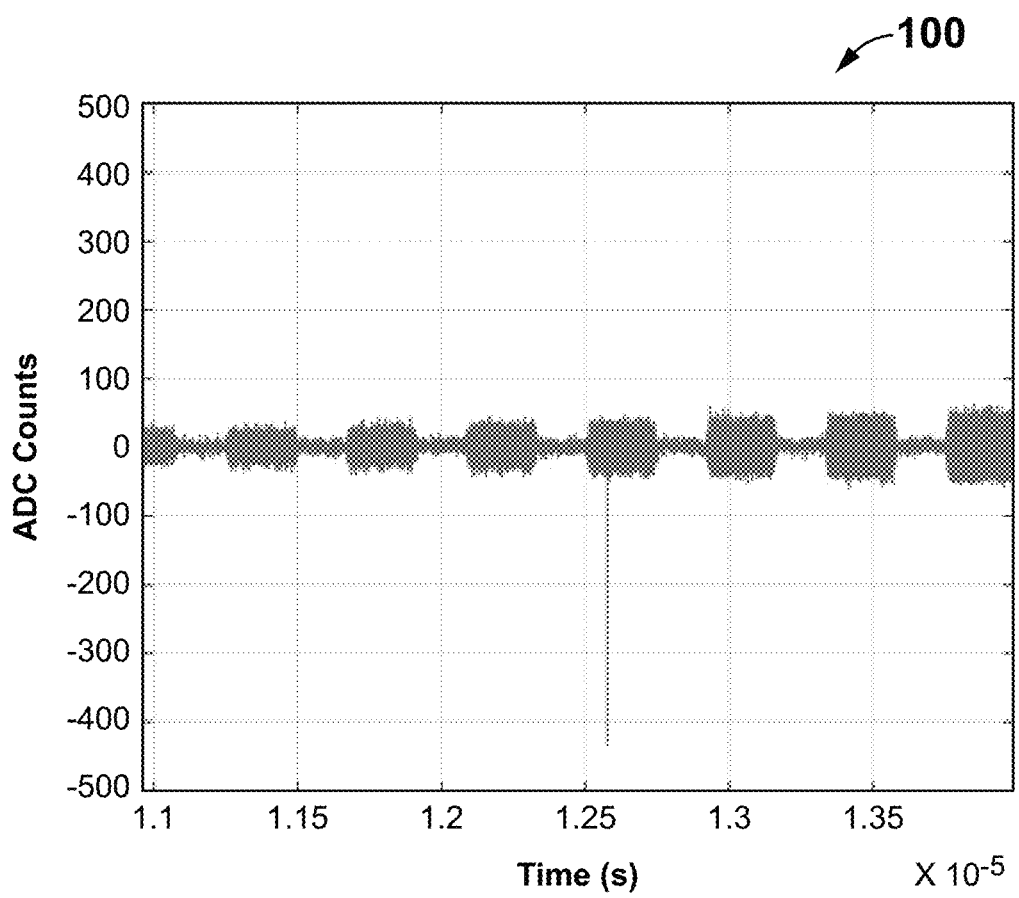
FIG. 1 exemplarily illustrates a digital data stream with a large sample error resulting from sparkle noise, according to one embodiment of the present invention.

A description of embodiments of the present invention will now be given with reference to the Figures. It is expected that the present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

As will be appreciated by one skilled in the art, aspects of the embodiments may be embodied as a device, system, method or program product. Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field-programmable gate arrays, programmable array logic, programmable logic devices or the like.

Modules may also be implemented in code and/or software for execution by various types of processors. An identified module of code may, for instance, comprise one or more physical or logical blocks of executable code which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and program products according to embodiments. It will be understood that each block of the schematic flowchart diagrams and/or schematic block diagrams, and combinations of blocks in the schematic flowchart diagrams and/or schematic block diagrams, can be implemented by code. These codes may be provided to a processor or other programmable data processing apparatus to produce a machine, such that the instructions, which execute via the processor or other programmable data processing apparatus, create means for implementing the functions/acts specified in the schematic flowchart diagrams and/or schematic block diagrams block or blocks.

The schematic flowchart diagrams and/or schematic block diagrams in the Figures illustrate the architecture, functionality, and operation of possible implementations of apparatuses, systems, methods and program products according to various embodiments. In this regard, each block in the schematic flowchart diagrams and/or schematic block diagrams may represent a module, segment, or portion of code, which comprises one or more executable instructions of the code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and code.

The description of elements in each figure may refer to elements of proceeding figures. Like numbers refer to like elements in all figures, including alternate embodiments of like elements.

According to the present invention, a real-time digital sparkle filter provides a system and method to identify and eliminate erroneous data samples without degrading the content of the data. In one embodiment, a real-time digital sparkle filter processes a digital data stream of high-speed ADC samples to identify and eliminate errors resulting from the sparkle noise phenomenon. In one embodiment, the real-time sparkle filter is implemented as digital logic in a field-programmable gate array (FPGA). In one embodiment, a method for processing the digital data stream runs continuously and uninterrupted. The method eliminates/avoids the loss of any samples. The elimination of the sparkle errors improves the quality of the data especially for digital signal applications requiring a high degree of amplitude measurement accuracy.

In one embodiment, the real-time digital sparkle filter operates on a continuous stream of digital data. In one embodiment, the stream of digital data is comprised of 16-bit samples from an ADC. Each sample represents the instantaneous voltage of the signal at the input of the ADC. In one embodiment, the voltage range is dependent on the ADC device. In one embodiment, the voltage ranges from about −Vpp/2 to about +Vpp/2, where Vpp is the peak-to-peak voltage of the input signal. In one embodiment, the range of values generated by the ADC for the 16-bit data would be −32,768 to +32,767. The real-time digital sparkle filter has been tested using sampling rates up to 3 GSPS. In one embodiment, the sample time at 3 GSPS is 0.333 ns per sample.

The stream of ADC data is evaluated in sets. In one embodiment, the sets could have variable lengths related to the sampling rate. At 3 GSPS, a set size of 32 samples are used, equating to 10.667 ns of data per set.

For each set, the mean, xm, is calculated where, $$xm = \frac{\sum_{i=1}^{n} x_i}{n}$$

For each set, the mean absolute deviation, xad, is also calculated where, $$xad = \frac{\sum_{i=1}^{n} |xi - xm|}{n}$$

For each sample of the set, a comparison is made between the sample value and 4 times the mean absolute deviation. In one embodiment, the mean absolute deviation is replaced by the mean value if the sample value is greater than 4 times. In one embodiment, the mean absolute deviation remains unchanged if the sample value is less than 4 times. In one embodiment, the number of samples in the resulting data set contains the same number of samples as the input data set.

In one embodiment, the process is run continuously and in an uninterrupted fashion. The logic is implemented using field-programmable gate arrays (FPGA) and is capable of processing data continuously at 3 GSPS with no data loss. In one embodiment, the process can be applied to the following including, but not limited to, continuous wave, pulsed signals, and noise without degradation to the signal content. The use of data derived thresholds makes the process adaptable to signals of varying amplitudes. In one embodiment, the real-time digital sparkle filter is then tested with commercial ADC devices running with 16-bit data at 3 GSPS, which indicates that approximately 0.25% of the data is typically identified as erroneous and altered.

Referring to FIG. 1, a graph 100 of a digital data stream with a large sample error resulting from sparkle noise, according to one embodiment of the present invention. In one embodiment, the sparkle noise is used in a pulsed waveform. The graph 100 has plotted against ADC counts (Y-axis) versus time interval (X-axis). The graph 100 shows a large, single sample error at the middle of the data set.

Figure 2:
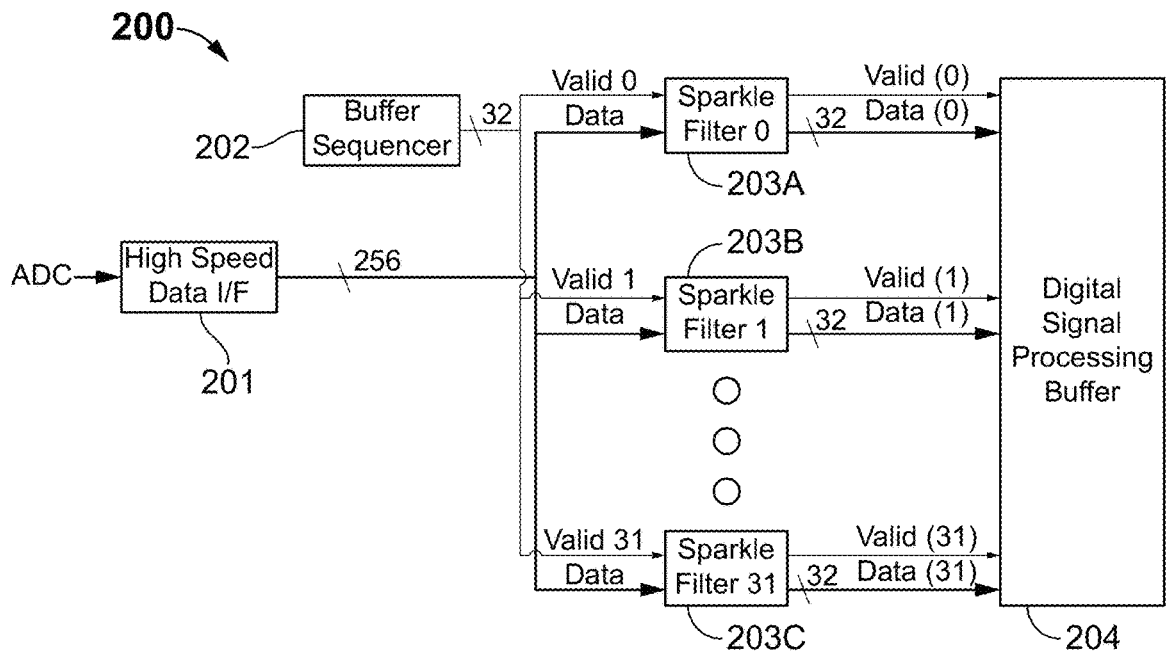
FIG. 2 exemplarily illustrates a block diagram of a real-time sparkle filter system, according to an embodiment of the present invention.

Referring to FIG. 2, a block diagram 200 of a real-time sparkle filter, according to one embodiment of the present invention. In one embodiment, the real-time sparkle filter comprises a high-speed data interface 201, a buffer sequencer 202, one or more sparkle filter paths (203A, 203B, 203C, and so on), and a digital signal processing buffer 204. In one embodiment, the high-speed data interface 201 receives input from an analog-digital converter or analog to digital converter (ADC) data. In one embodiment, the ADC data is 16-bit samples transferred using high-speed data interface 201. In one embodiment, the high-speed data interface 201 is the industry standard JESD204B interface. In one embodiment, the ADC data is received at speeds up to 3 GSPS. In one embodiment, a pipelined architecture is implemented using 32 parallel sparkle filter data paths (203A-203C), thereby reducing the effective data throughput rate. In one embodiment, the buffer sequencer 202 includes logic to control the distribution of data to each of the sparkle filter data paths. In one embodiment, the digital signal processing buffer 204 receives the filtered data, thereby making it available for additional processing steps.

Figure 3:
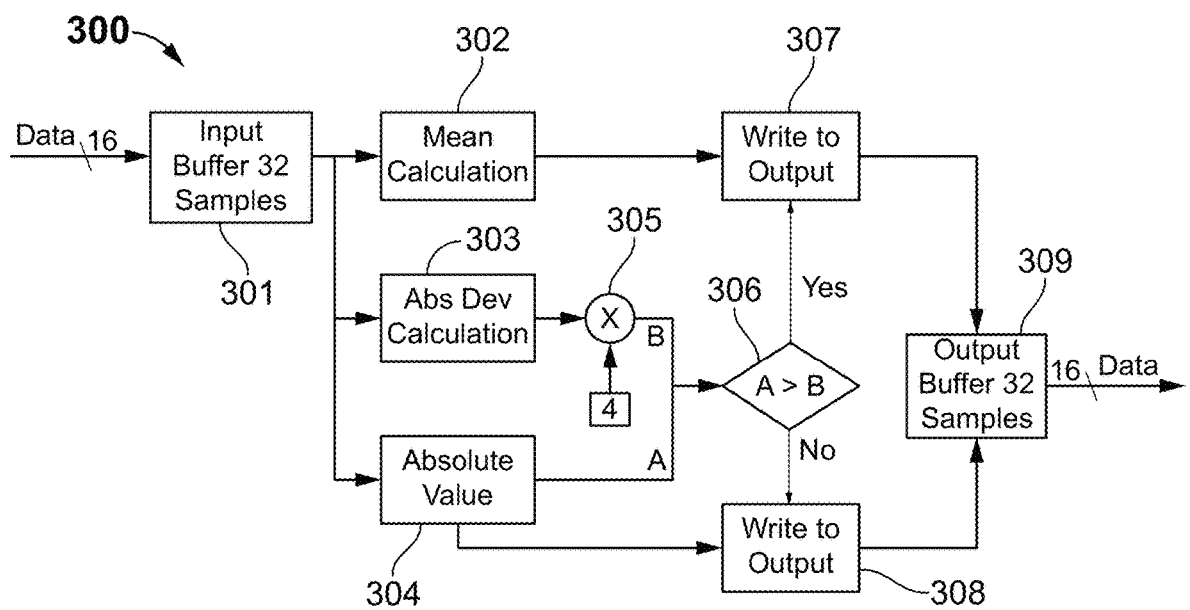
FIG. 3 exemplarily illustrates a block diagram of the sparkle filter, according to an embodiment of the present invention.

Referring to FIG. 3, a block diagram 300 of the sparkle filter illustrated in FIG. 2, according to one embodiment of the present invention. In one embodiment, the sparkle filter further comprises an input buffer 301, one or more logic, and an output buffer 309. The input buffer 301 receives the digital data stream up to 32 samples using a first in first out buffer mechanism. In one embodiment, the samples are of 16-bit data. In one embodiment, the one or more logic includes, but not limited to, a mean calculation logic 302, an absolute deviation calculation logic 303, an absolute value logic 304, a multiplier logic 305, and a decision logic 306. In one embodiment, the mean calculation logic 302 calculates the average of the input data. In one embodiment, the absolute deviation calculation logic 303 calculates the absolute deviation of the input data. In one embodiment, the absolute value logic 304 calculates the absolute value of each sample in the input data. In one embodiment, the multiplier logic 305 multiples the absolute deviation by creating the sparkle threshold. In one embodiment, the absolute deviation is created by 4 digital shifts in two bit positions to the left.

In one embodiment, the decision logic 306 compares the absolute value of each sample in the input data (element A) with the sparkle noise threshold (element B). If the absolute value of the data sample is greater than 4 times the absolute deviation then the sample is replaced by the mean value of the data set and written to the output buffer as write to output 307. If the absolute value of the data sample is less than or equal to 4 times the absolute deviation then the sample is unchanged and written to the output buffer as write to output 308. In one embodiment, the output buffer 309 contains the processed sample's output of the sparkle filter process for further use.

Figure 4:
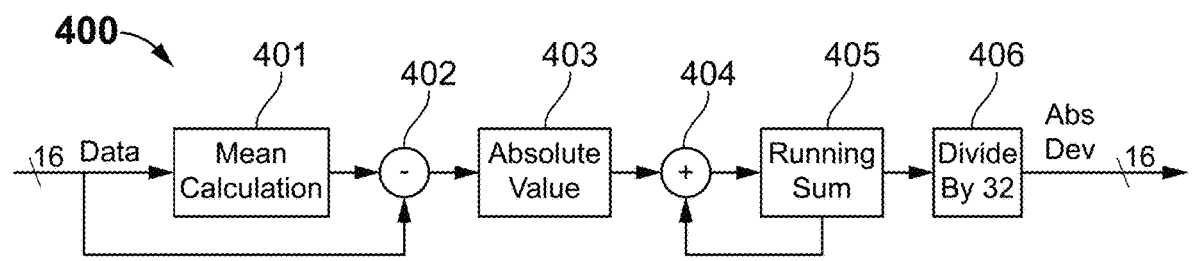
FIG. 4 exemplarily illustrates a block diagram for absolute deviation calculation of the sparkle filter, according to one embodiment of the present invention.

Referring to FIG. 4, a block diagram 400 of the absolute deviation calculation as shown in FIG. 3, according to one embodiment of the present invention. In one embodiment, the block diagram 400 comprises one or more logic including a mean calculation logic 401, a subtraction logic 402, an absolute value logic 403, an addition logic 404, a running sum register 405, and a division logic 406. In one embodiment, the mean calculation logic 401 calculates the average of the input data. In one embodiment, the subtraction logic 402 reduces each input data sample by the mean value. In one embodiment, the absolute value logic 403 calculates the absolute value of each sample. In one embodiment, the addition logic 404 adds the absolute value of each means adjusted sample. In one embodiment, the running sum register 405 stores the sum of the absolute values of the mean adjusted data. In one embodiment, the division logic 406 divides the running sum by the number of samples in the set to create the absolute deviation.

Figure 5:
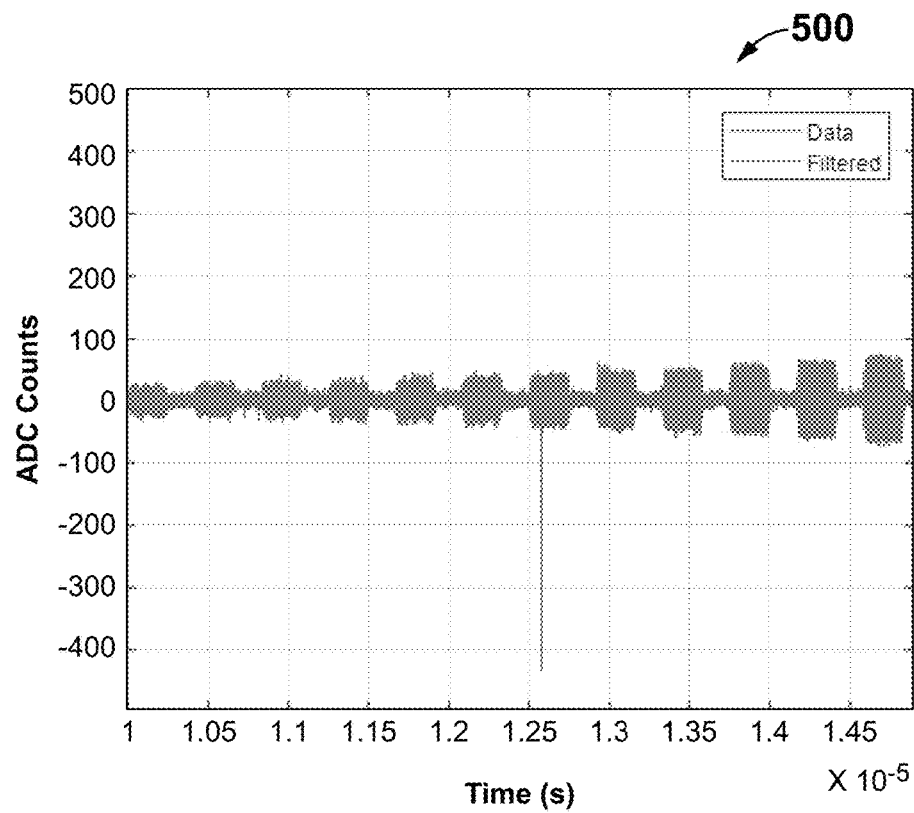
FIG. 5 exemplarily illustrates the output of the real-time sparkle filter process of FIG. 1 applied to a pulse train, according to one embodiment of the present invention.

Referring to FIG. 5, a graphical representation 500 illustrating the output of the real-time sparkle filter process of FIG. 1 applied to a pulse train, according to one embodiment of the present invention. The graph 500 has plotted against ADC counts (Y-axis) versus time period (X-axis). The original pulse train data stream with sparkle noise is overlaid with the output of the sparkle filter. The large, single sample error is successfully eliminated. Upon eliminating the error, the amplitude of the data set is changed. In one embodiment, the change in amplitude over the data set is processed without error demonstrating the capacity of the real-time digital sparkle system to adapt to the signal conditions in real-time.

Figure 6:
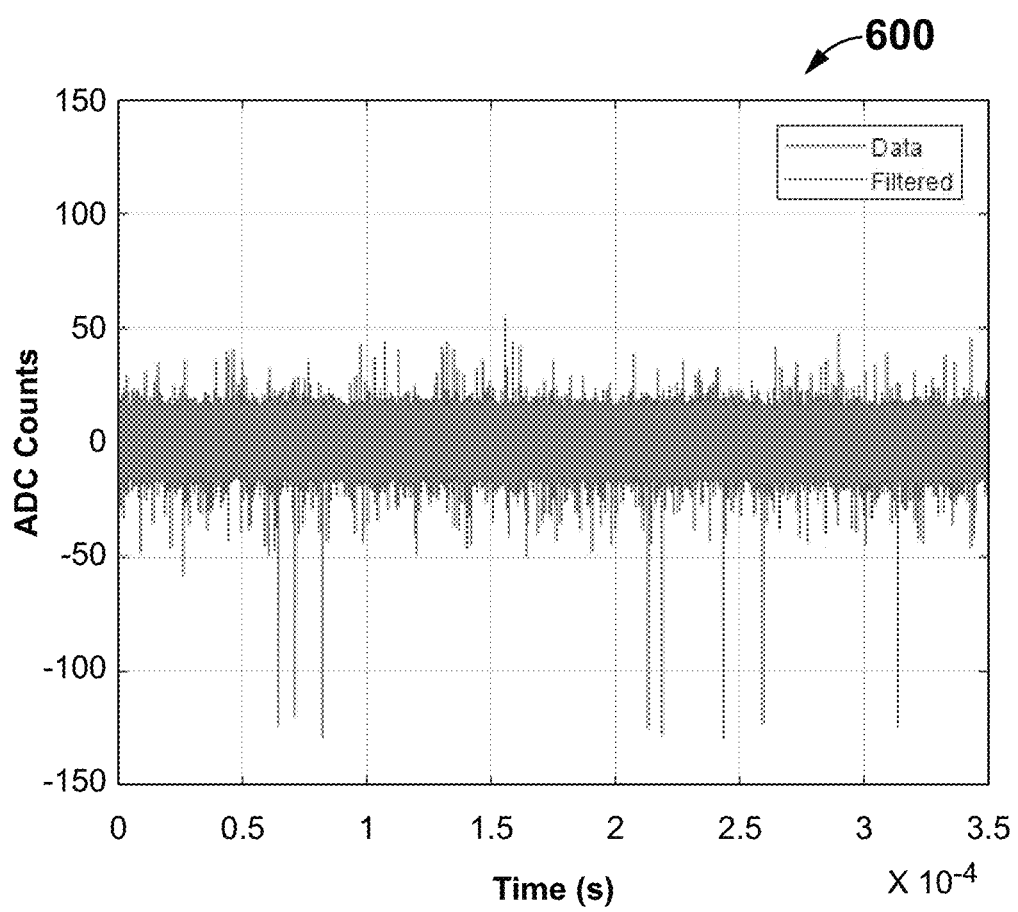
FIG. 6 exemplarily illustrates the output of the real-time sparkle filter process of FIG. 1 applied to noise, according to one embodiment of the present invention.

Referring to FIG. 6, a graphical representation 600 of the output of the real-time sparkle filter process of FIG. 1 applied to noise, according to one embodiment of the present invention. The graph 600 has plotted against ADC counts (Y-axis) versus time period (X-axis). In one embodiment, the noise overlaid with the resulting filtered data, thereby eliminating the large, single errors. In one embodiment, the large, single errors are eliminated by leaving about 99.75% of unaltered data.

Figure 7:
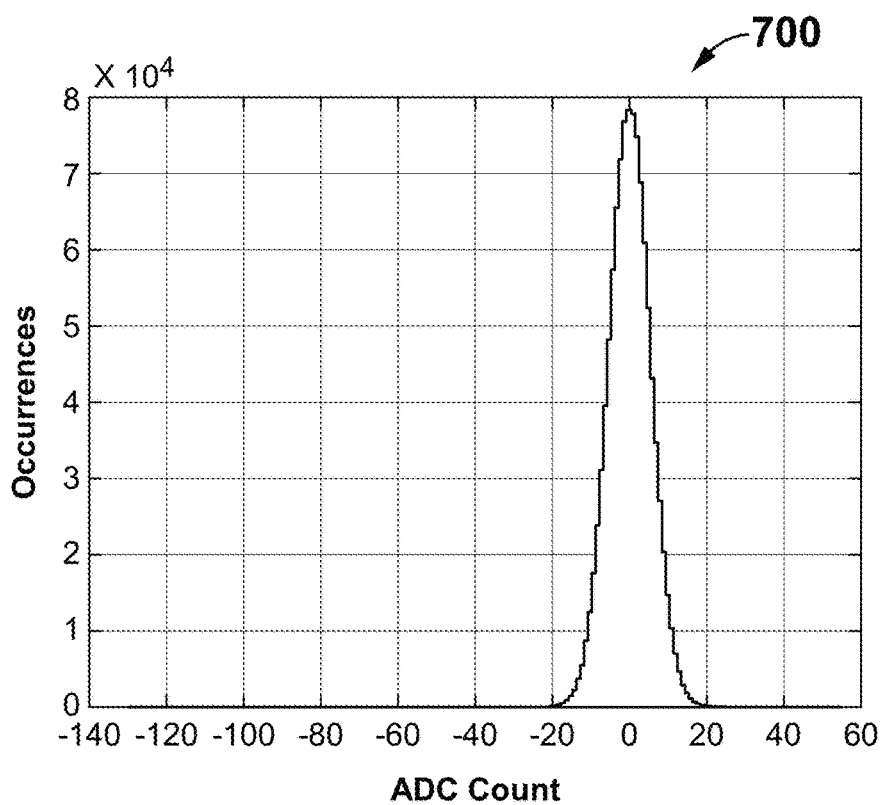
FIG. 7 exemplarily illustrates a histogram of the noise data, according to one embodiment of the present invention.

FIG. 7 exemplarily illustrates a histogram 700 of the noise data, according to one embodiment of the present invention. The histogram 700 is obtained using ADC counts (X-axis) and a number of occurrences (Y-axis). In one embodiment, the histogram 700 is obtained from the noise data shown in FIG. 6 before filtering the noise. In one embodiment, the normal distribution of the noise is disturbed due to the large data outliers. In one embodiment, the large data outliers ranging from about −130 to about +56.

Figure 8:
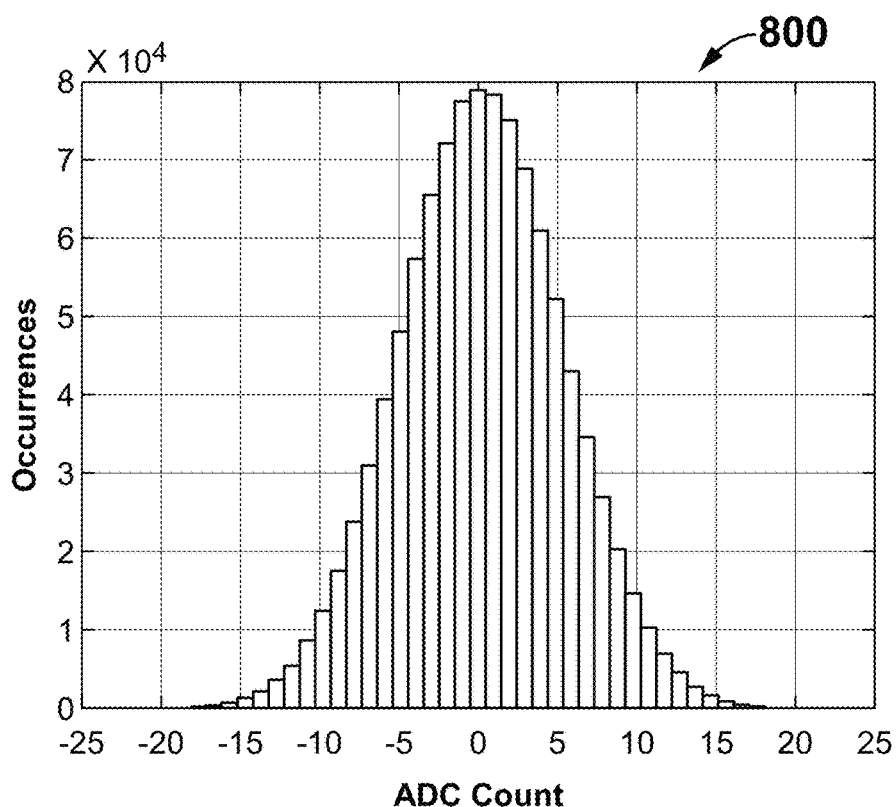
FIG. 8 exemplarily illustrates a histogram of the filtered noise data, according to one embodiment of the present invention.

FIG. 8 exemplarily illustrates a histogram 800 of the filtered noise data, according to one embodiment of the present invention. The histogram 800 is obtained using ADC counts (X-axis) and a number of occurrences (Y-axis). In one embodiment, the histogram 800 is obtained from the noise data shown in FIG. 6 after filtering the noise. The normal distribution of the noise is achieved with the data values. In one embodiment, the data values ranging from about −24 to about +24.

According to the present invention, the real-time digital sparkle filter utilizes a method for processing a digital data stream continuously and in real-time for the purposes of identifying and eliminating digital sparkle noise. In one embodiment, the method is utilized for continuous wave signals. In another embodiment, the method is utilized for pulsed signals. In yet another embodiment, the method is utilized for noise-only signal. In one embodiment, the method works independently for the amplitude and frequency of the input samples, without affecting the content of the input samples. In one embodiment, the method also works on noise signals without eliminating any input data samples.

Advantageously, the present invention provides a system and method to identify and eliminate erroneous data samples without degrading the content of the data. The elimination of the sparkle errors improves the quality of the data especially for digital signal applications requiring a high degree of amplitude measurement accuracy. The real-time digital sparkle filter benefits digital signal processing applications operating continuously on 100% of the data samples using pipelined architectures requiring accurate, precise amplitude measurements. The present invention uses real-time statistical analysis of the data to identify and replace erroneous samples. As such, this system and methodology work reliably on continuous wave signals, pulsed signals and noise-only data. The method works independently of the amplitude and frequency of the input signal. The real-time digital sparkle filter operates continuously on 16-bit data samples without losing any samples at speeds up to 3 giga-samples per second (GSPS).

Although a single embodiment of the invention has been illustrated in the accompanying drawings and described in the above detailed description, it will be understood that the invention is not limited to the embodiment developed herein, but is capable of numerous rearrangements, modifications, substitutions of parts and elements without departing from the spirit and scope of the invention.

The foregoing description comprises illustrative embodiments of the present invention. Having thus described exemplary embodiments of the present invention, it should be noted by those skilled in the art that the within disclosures are exemplary only, and that various other alternatives, adaptations, and modifications may be made within the scope of the present invention. Merely listing or numbering the steps of a method in a certain order does not constitute any limitation on the order of the steps of that method. Many modifications and other embodiments of the invention will come to mind to one skilled in the art to which this invention pertains having the benefit of the teachings presented in the foregoing descriptions. Although specific terms may be employed herein, they are used only in generic and descriptive sense and not for purposes of limitation. Accordingly, the present invention is not limited to the specific embodiments illustrated herein.

What is claimed is:

1. A real-time digital sparkle filter for processing a continuous stream of digital data, comprising:
    a high-speed data interface configured to receive sample data from an analog to digital converter (ADC);
    a digital sparkle filter configured to operate continuously on the sample data without losing any samples, wherein the digital sparkle filter comprises one or more logic implemented using field-programmable gate arrays (FPGAs) configured to continuously process the data without degrading the signal content;
    and a buffer sequencer having an input buffer and an output buffer, wherein the input buffer receives the digital data stream data using a first in first out buffer mechanism, and the output buffer receives the processed output of the sparkle filter, thereby eliminating the sparkle noise and transmitting the output of the sparkle filter without degrading data content,
    wherein digital sparkle noise is defined to be coding errors in the continuous stream of digital data related to the metastability of the comparators used in the analog to digital converter (ADC).

2. The sparkle filter of claim 1, uses a continuous stream of digital data for identifying and eliminating the digital sparkle noise.

3. The sparkle filter of claim 1, wherein the one or more logic are implemented using field-programmable gate arrays (FPGAs) configured to continuously process the data at 3 gigs-samples-per-second (GSPS) without degradation to the signal content of the data.

4. The sparkle filter of claim 1, wherein the one or more logic includes a mean calculation logic, an absolute deviation calculation logic, an absolute calculation logic, a multiplier logic, and a sparkle noise threshold comparison logic.

5. The sparkle filter of claim 4, wherein the mean calculation logic is configured to calculate the average of the input data.

6. The sparkle filter of claim 4, wherein the absolute deviation calculation logic is configured to calculate the absolute deviation of the input data.

7. The sparkle filter of claim 4, wherein the absolute calculation logic consists of mean calculation logic, addition logic, absolute value calculation logic, summation logic, and division logic.

8. The sparkle filter of claim 4, wherein the absolute calculation logic is configured to calculate the absolute value of each sample in the input data.

9. The sparkle filter of claim 4, wherein the multiplier logic is configured to multiply the absolute deviation by creating the sparkle threshold.

10. The sparkle filter of claim 4, wherein the sparkle noise threshold comparison logic compares the absolute value of each sample in the input data with the sparkle noise threshold.

11. The sparkle filter of claim 10, wherein the sample is replaced by the mean value of the data set and written to the output buffer when the absolute value of the data sample is greater than 4 times the absolute deviation.

12. The sparkle filter of claim 10, wherein the sample is unchanged and written to the output buffer when the absolute value of the data sample is less than or equal to 4 times the absolute deviation.

13. The sparkle filter of claim 1, wherein the continuous stream of digital data is any of continuous wave signals, pulsed signals, and noise-only data.

14. The sparkle filter of claim 1, works independently f the amplitude of the continuous stream of digital data.

15. The sparkle filter of claim 1, works independently of the frequency of continuous stream of digital data.

* * * * *

UNITED STATES PATENT AND TRADEMARK OFFICE
CERTIFICATE OF CORRECTION

| | | |
|---|---|---|
| PATENT NO. | : 11,824,552 B2 | |
| APPLICATION NO. | : 17/233854 | |
| DATED | : November 21, 2023 | |
| INVENTOR(S) | : Frederick J. Ilsemann | |

It is certified that error appears in the above-identified patent and that said Letters Patent is hereby corrected as shown below:

On the Title Page

Item (71) Applicant delete "Fredeick" and insert --Frederick--.

Item (72) Inventor delete "Fredeick" and insert --Frederick--.

Signed and Sealed this
Nineteenth Day of March, 2024

Katherine Kelly Vidal
*Director of the United States Patent and Trademark Office*